United States Patent
Swart

(10) Patent No.: US 7,071,716 B2
(45) Date of Patent: *Jul. 4, 2006

(54) APPARATUS FOR SCAN TESTING PRINTED CIRCUIT BOARDS

(75) Inventor: Mark A. Swart, Yorba Linda, CA (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/897,182

(22) Filed: Jul. 22, 2004

(65) Prior Publication Data

US 2005/0001640 A1    Jan. 6, 2005

Related U.S. Application Data

(62) Division of application No. 09/991,199, filed on Nov. 16, 2001, now Pat. No. 6,788,078.

(51) Int. Cl.
   *G01R 31/02*   (2006.01)
   *G01R 31/28*   (2006.01)
(52) U.S. Cl. .................................. 324/754
(58) Field of Classification Search .......... None
   See application file for complete search history.

(56) References Cited

U.S. PATENT DOCUMENTS

| | | |
|---|---|---|
| 3,629,702 A | 12/1971 | Henken |
| 4,818,933 A | 4/1989 | Kerschner et al. |
| 4,836,797 A | 6/1989 | Riechelmann |
| 4,970,461 A | 11/1990 | LePage |
| 5,017,863 A | 5/1991 | Mellitz |
| 5,094,584 A | 3/1992 | Bullock |
| 5,113,133 A | 5/1992 | Conti et al. |
| 5,124,660 A | 6/1992 | Cilingiroglu |
| 5,138,266 A | 8/1992 | Stearns |
| 5,202,623 A | 4/1993 | LePage |

(Continued)

FOREIGN PATENT DOCUMENTS

DE    19730516    1/1999

(Continued)

OTHER PUBLICATIONS

Degroat, P.M. et al., "Finding Shorts in Printed Circuit Boards," IBM Technical Disclosure Bulletin, vol. 12, No. 5, Oct. 1969, pp. 655-656.

(Continued)

*Primary Examiner*—Jermele Hollington
*Assistant Examiner*—Trung Q. Nguyen
(74) *Attorney, Agent, or Firm*—Christie, Parker & Hale, LLP

(57) ABSTRACT

A scan test apparatus having at least an upper layer of conductive and compliant material and may include a lower layer of conductive and compliant material sized to cover the upper and lower surfaces of the printed circuit board to be tested. Electrical current is introduced into the conductive layers which shorts out the circuits on the printed circuit board. An electrical contactor is positioned on either side of the conductive layers on both sides of the printed circuit board. The printed circuit board is passed through the upper and lower conductive layers and the contactors by rollers positioned on each end of the scan test machine. The contactor sends a test signal from the circuit board to measurement electronics. Other embodiments include the shorting matrix to be movable and the printed circuit board being fixed and include non-contact sensors or arrays of electrical contactors.

2 Claims, 13 Drawing Sheets

U.S. PATENT DOCUMENTS

| | | | |
|---|---|---|---|
| 5,268,645 A | 12/1993 | Prokoff et al. |
| 5,270,643 A | 12/1993 | Richardson et al. |
| 5,369,431 A | 11/1994 | Levy et al. |
| 5,469,064 A | 11/1995 | Kerschner et al. |
| 5,493,236 A | 2/1996 | Ishii et al. |
| 5,506,510 A | 4/1996 | Blumenau |
| 5,508,627 A | 4/1996 | Patterson |
| 5,517,110 A | 5/1996 | Soiferman |
| 5,553,700 A | 9/1996 | Smith et al. |
| 5,587,664 A | 12/1996 | Banitt et al. |
| 5,729,146 A | 3/1998 | Swart |
| 5,771,144 A | 6/1998 | Kim |
| 5,773,988 A | 6/1998 | Sayre et al. |
| 6,145,648 A | 11/2000 | Teichman et al. |
| 6,191,600 B1 | 2/2001 | Swart |
| 6,268,719 B1 | 7/2001 | Swart |
| 6,572,396 B1 | 6/2003 | Rathburn |
| 6,788,078 B1 * | 9/2004 | Swart ........................ 324/754 |

FOREIGN PATENT DOCUMENTS

| | | | |
|---|---|---|---|
| EP | 0128107 | A1 | 12/1984 |
| EP | 0424270 | A2 | 4/1991 |
| EP | 0424270 | A3 | 4/1991 |
| EP | 0731360 | A2 | 9/1996 |
| EP | 0731360 | A3 | 9/1996 |
| EP | 0773445 | A | 5/1997 |
| EP | 0884596 | A2 | 12/1998 |
| EP | 1059538 | A2 | 12/2000 |
| GB | 2149130 | A | 6/1985 |
| GB | 2265224 | A | 9/1993 |
| GB | 2267970 | A | 12/1993 |
| JP | 58-27784 | U | 2/1983 |
| JP | 60-46470 | A | 3/1985 |
| JP | 61-274278 | A | 12/1986 |
| JP | 62-285072 | A | 12/1987 |
| JP | 63-90173 | U | 6/1988 |
| JP | 63-157675 | U | 10/1988 |
| JP | 2-2946 | A | 1/1990 |
| JP | 2-13862 | A | 1/1990 |
| JP | 2-130483 | A | 5/1990 |
| JP | 3-152481 | A | 6/1991 |
| JP | 3-206983 | A | 9/1991 |
| JP | 4-259862 | A | 9/1992 |
| JP | 4-46217 | Y2 | 10/1992 |
| JP | 4-127576 | U | 11/1992 |
| JP | 5-273305 | A | 10/1993 |
| JP | 6-11498 | Y2 | 3/1994 |
| JP | 7-83954 | A | 3/1995 |
| JP | 7-92227 | A | 4/1995 |
| JP | 7-151834 | A | 6/1995 |
| JP | 8-15361 | A | 1/1996 |
| JP | 8-189939 | A | 7/1996 |
| WO | WO 96/26446 | A1 | 8/1996 |

OTHER PUBLICATIONS

Japanese Patent Abstract: Publication No. 02-259478, Publication Date Oct. 22, 1990; 2 pages.

* cited by examiner

APPARATUS FOR SCAN TESTING PRINTED CIRCUIT BOARDS

CROSS-REFERENCE TO RELATED APPLICATION(S)

This application is a divisional of U.S. application Ser. No. 09/991,199, filed Nov. 16, 2001 now U.S. Pat. No. 6,788,078.

FIELD OF THE INVENTION

This invention relates to the automatic testing of printed circuit boards, and more particularly, to a scan test apparatus which scans test sites on a printed circuit board to discern continuities, isolations and eliminates test sites from complete test program when confirmed correct.

BACKGROUND OF THE INVENTION

Automatic test equipment for checking printed circuit boards has long involved use of a "bed of nails" test fixture in which the circuit board is mounted during testing. This test fixture includes a large number of nail-like spring-loaded test probes arranged to make electrical contact under spring pressure with designated test points on the circuit board under test, also referred to as the unit under test or "UUT." Any particular circuit laid out on a printed circuit board is likely to be different from other circuits, and consequently, the bed of nails arrangement for contacting test points in the board must be customized for that particular circuit board. When the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture superimposed on the array of test probes. During testing, the spring-loaded probes are brought into spring-pressure contact with the test points on the circuit board under test. Electrical test signals are then transferred from the board to the test probes and then to the exterior of the fixture for communication with a high-speed electronic test analyzer which detects continuity or lack of continuity between various test points in the circuits on the board.

Various approaches have been used in the past for bringing the test probes and the circuit board under test into pressure contact for testing. One class of these fixtures is a "wired test fixture" in which the test probes are individually wired to separate interface contacts for use in transmitting test signals from the probes to the external electronically controlled test analyzer. These wired test fixtures are often referred to as "vacuum test fixtures" since a vacuum is applied to the interior of the test fixture housing during testing to compress the circuit board into contact with the test probes. Customized wire test fixtures of similar construction also can be made by using mechanical means other than vacuum to apply the spring force necessary for compressing the board into contact with the probes during testing.

The wire-wrapping or other connection of test probes, interface pins and transfer pins for use in a wired test fixture can be time intensive. However, customized wired test fixtures are particularly useful in testing circuit boards with complex arrangements of test points and low-volume production boards where larger and more complex and expensive electronic test analyzers are not practical.

As mentioned previously, the customized wired test fixtures are one class of fixtures for transmitting signals from the fixture to the external circuit tester. A further class of test fixtures is the so-called "dedicated" test fixtures, also known as a "grid-type fixture," in which the random pattern of test points on the board are contacted by translator pins which transfer test signals to interface pins arranged in a grid pattern in a receiver. In these grid-type testers, fixturing is generally less complex and simpler than in the customized wired test fixtures. A typical dedicated or grid fixture contains test electronics with a huge number of switches connecting test probes in a grid base to corresponding test circuits in the electronic test analyzer. In one embodiment of a grid tester as many as 40,000 switches are used. When testing a bare board on such a tester, a translator fixture supports translator pins that communicate between a grid pattern of test probes in a grid base and an off-grid pattern of test points on the board under test. In one prior art grid fixture so-called "tilt pins" are used as the translator pins. The tilt pins are straight solid pins mounted in corresponding pre-drilled holes in translator plates which are part of the translator fixture. The tilt pins can tilt in various orientations to translate separate test signals from the off-grid random pattern of test points on the board to the grid pattern of test probes in the grid base.

Translator fixtures can be constructed and assembled with a plurality of translator plates made from a plastic material such as Lexan. The translator plates are stacked in the fixture between corresponding sets of spacers aligned with one another vertically to form "stand-offs" spaced apart around the periphery of the fixture. The spacers hold the translator plates in a fixed position spaced apart vertically from one another and reasonably parallel to each other. The translator plates at each level of the fixture have pre-drilled patterns of alignment holes that control the position of each tilt pin in the translator fixture.

Several problems are associated with these types of test fixtures when the test points on the printed circuit board are positioned very closely together and are very thin. Individual test points are commonly referred to as test pads, and a group of test pads are commonly known as a test pack. When the tilt pins contact very thin test pads, the pads can be crushed or bent by the tilt pins. Depending upon the degree of damage to the test pads, and how closely they are positioned, individual pads can be permanently shorted together during testing.

A second problem occurring with these types of test fixtures is the difficulty in achieving accurate test results for a test pack when the pads are very closely spaced. It becomes very difficult to direct a tilt pin to each pad within the pack when the pads are so closely spaced. Slight misalignments of test pins can affect the test results, reducing test accuracy.

A third problem is encountered for packs having a grid density of pads which is greater than the grid density of the test probes, such as when the test pack is formed as a ball grid array (BGA) or a quad flat pack (QFP). In such instances there are not enough translation pins available for testing each test pad and thorough testing of the pack is not possible.

To address these problems a printed circuit board test fixture capable of accurately and safely testing circuit boards having small scale test packs was developed which included a pneumatically actuated shorting plate positioned in the fixture corresponding to the location on the printed circuit board where a group of very closely spaced test points were to be tested. A hole was cut through the upper translator plates corresponding to the dimension of the shorting plate to allow the shorting plate to engage the unit under test. A layer of compliant conductive media was positioned over the upper surface of the shorting plate for electrical connection to the test points. The shorting plate included a snap fitting for attachment to an air cylinder extending downwardly through the layers of translator plates. The air cylinder was attached at the bottom of the fixture by a base plug which snaps into a base receptacle rigidly secured to a lower translator plate of the fixture.

During testing of the unit under test, the air cylinder was energized, raising the shorting plate into contact with the test pack, effectively shorting them together for testing without bending or damaging the test points.

A problem with this method is that since all the test sites are shorted together during testing it can not be determined whether one or more individual test sites within the pack are incorrectly shorted together.

An alternative method for testing densely spaced test packs is with a flying prober to touch each individual pad within the pack. A prober typically performs two types of tests which are isolation testing and continuities testing. In isolation testing the prober will contact one point within two networks. In continuity testing each test pad must be contacted. This method of continuity testing is undesirable due to the extremely time consuming process of contacting each test pad.

Consequently a need exists for improved test equipment for testing printed circuit boards which quickly produces test results.

SUMMARY OF THE INVENTION

The present invention comprises a scan test machine for continuity testing of bare printed circuit boards. Previously in continuity testing of printed circuit boards, the tester physically contacted 100% of the test sites on the circuit board checking for potential problems with the circuit board. The scan test machine of the present invention, on the contrary, does not test the board to determine problems but rather quickly scans the board to find proper connections and then eliminates those test sites from the test routine. One scan test machine is shown in U.S. Pat. No. 6,191,600 B1 owned by applicant and the disclosure of which is incorporated herein by reference. The scan test machine of the present invention comprises a shorting matrix which can be an upper layer of conductive and compliant material and may include a lower layer of conductive and compliant material sized to cover the upper and lower surfaces of the printed circuit board to be tested. Electrical current is introduced into the conductive layers which shorts out the circuits on the printed circuit board. An electrical contactor is positioned on either side of the conductive layers on both sides of the printed circuit board.

The unit under test is passed through the upper and lower conductive layers and the contactors by rollers positioned on each end of the scan tester. The contactors send a test signal from the circuit board to the measurement electronics. The measurement electronics includes software having stored test data for the particular unit under test. The stored test data is compared to the test data and, if they match, those test locations are eliminated from further testing. Other embodiments include the shorting matrix to be moveable and the printed circuit board being fixed and non-contact sensors or arrays of electrical contactors.

These and other aspects of the invention will be more fully understood by referring to the following detailed description and the accompanying drawings.

DETAILED DESCRIPTION OF THE INVENTION

Figure 1:
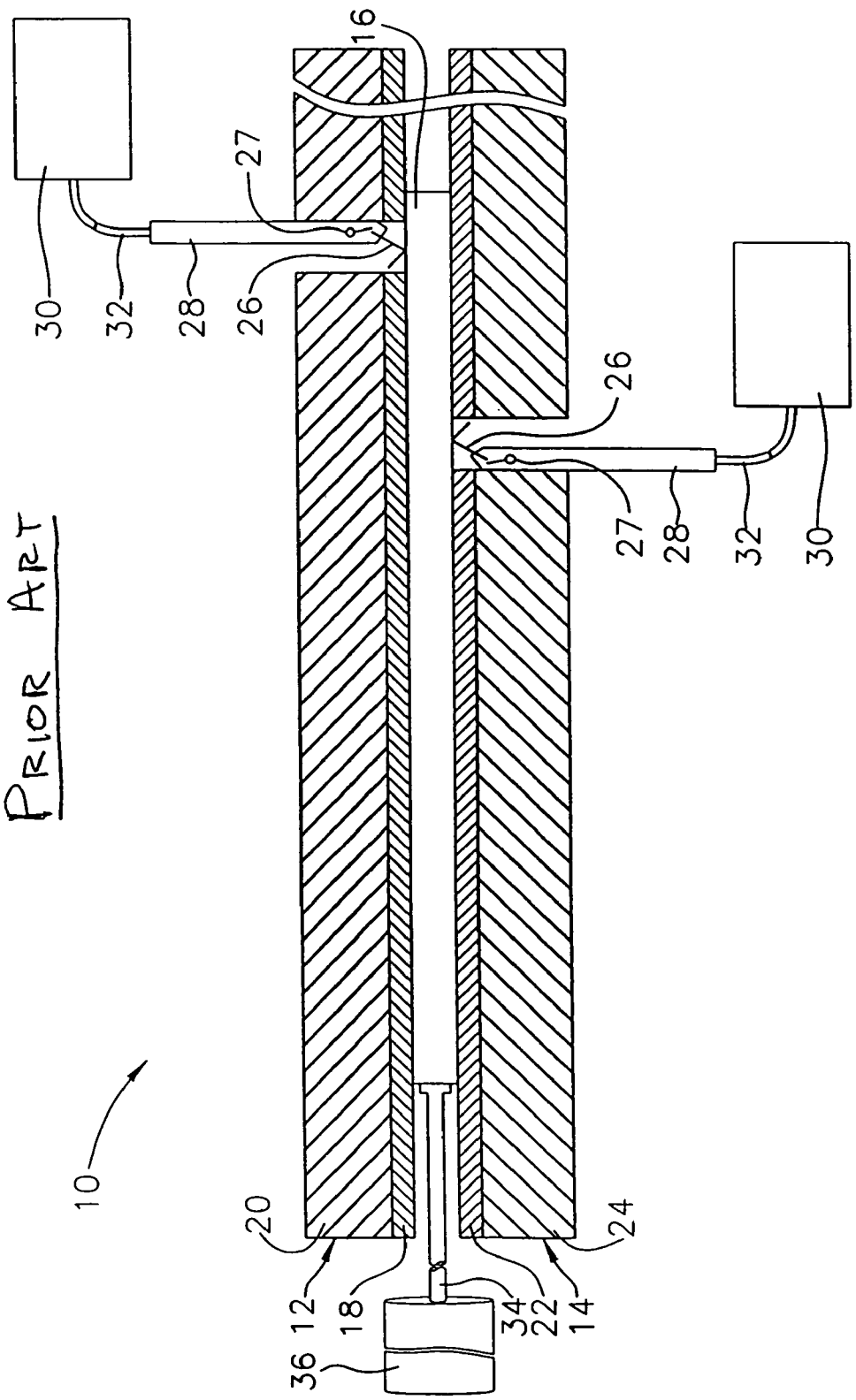
FIG. 1 is a side schematic view of a scan test apparatus of U.S. Pat. No. 6,191,600 B1.

One embodiment of a scan test apparatus 10 of U.S. Pat. No. 6,191,600 B1 is shown in FIG. 1. This scan test apparatus includes an upper shorting layer 12 and a lower shorting layer 14 which during testing sandwiches the printed circuit board to be tested or unit under test 16. The upper shorting layer comprises an inner conductive layer 18 such as conductive cloth or metal and an outer compliant layer 20 such as foam. Similarly, the lower shorting layer has an inner conductive layer 22 and an outer compliant layer 24 made of the same materials as the upper shorting layer. Alternatively, the upper shorting layer 12 and the lower shorting layer 14 can consist of a single material which is both conductive and compliant such as conductive rubber.

Extending across either or both of the upper shorting layer and the lower shorting layer is a row of wiper brushes 26. Each wiper brush is wired to discrete switches 27 in a printed circuit board 28. The printed circuit board 28 is connected to measurement electronics 30 by a cable 32.

The upper and lower shorting layers must contact the entire unit under test except for the row of wiper brushes which is wider than the width of the unit under test. If a row of wiper brushes is located in both the upper and lower shorting layers, they must be offset from one another so as not to contact the unit under test at the same location along the length of the board. The unit under test 16 is sandwiched between the upper and lower shorting layers which shorts out both sides of the unit under test by an electrical current introduced into the conductive layers of the shorting layers. With a shorting current introduced into the unit under test, it is pushed underneath the wiper brushes 26 by a push rod 34. Push rod 34 is actuated by a pneumatic cylinder, a hydraulic cylinder or a linear motor 36.

Figure 2:
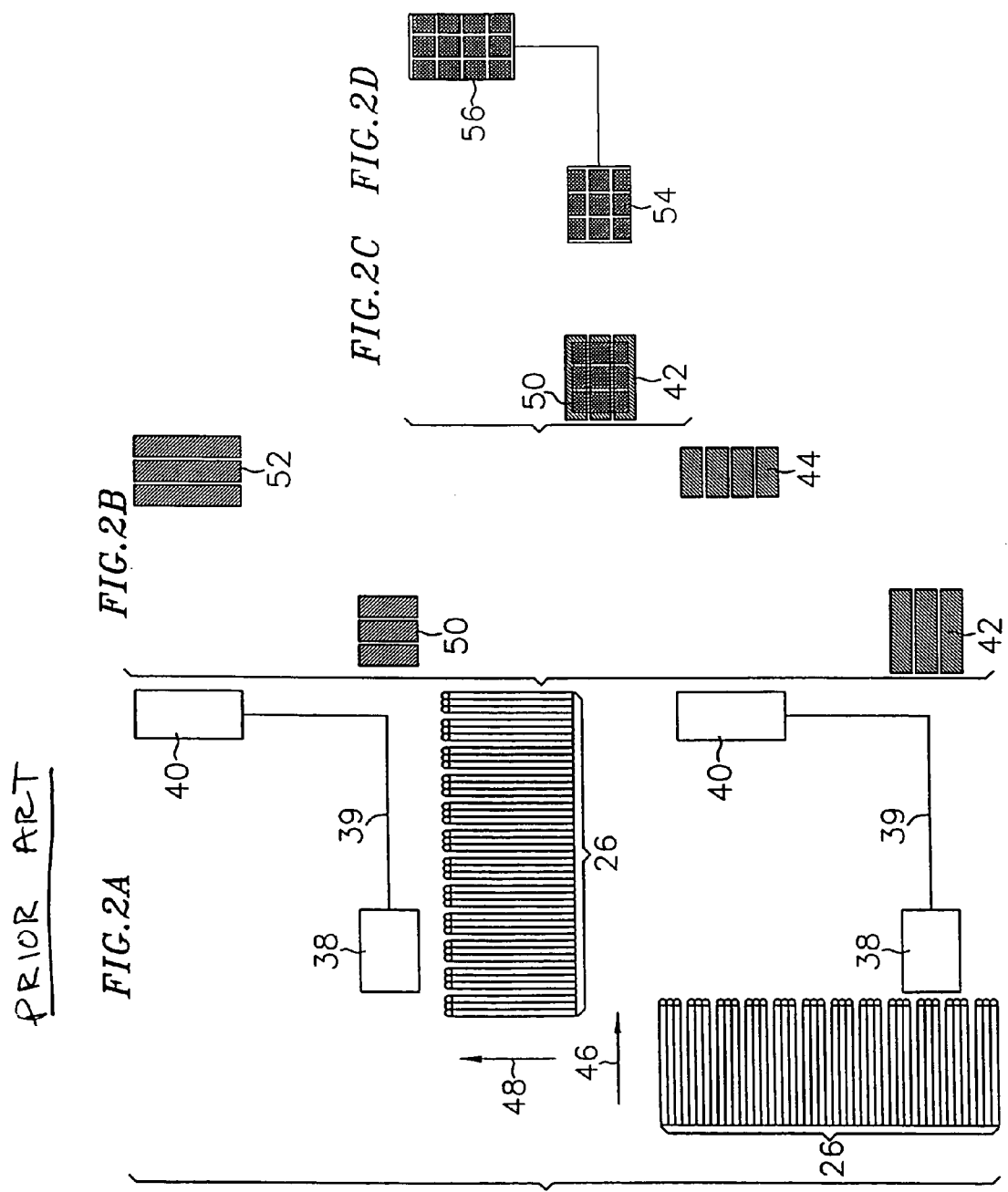
FIGS. 2a–2d are schematic detail views of the wiper brush and test signals generated by the scan test apparatus of FIG. 1.

The unit under test 16 includes numerous test pads connected by traces, such as for example test pads 38 and 40 connected by trace 39, as shown in FIG. 2a. As shown in FIGS. 2a through 2d, as the unit under test 16 passes beneath the wiper brushes 26 individual test pads 38 and 40, if properly connected and carrying a current, will turn on the individual wiper brushes contacting the test pads. The turned on wiper brushes will send a signal to the measurement electronics which will generate a first test image 42 and 44 for test pads 38 and 40 by software programmed into the measurement electronics. Individual test pads on the unit under test will vary in size and may not coincide with the exact width of adjacent wiper brushes. Consequently, the first test images 42 and 44 generated will coincide with the width of the wiper brushes turned on by the test pads which may not be the exact physical dimension of the test pad itself. First test images 42 and 44 are generated when the unit under test is passed beneath the wiper brushes in direction 46. Since the first test image may be larger than the actual test pads, the unit under test is rotated 90° and passed beneath the wiper brushes a second time in direction 48. As the wiper brushes contact the test pads 38 and 40 for the second time, they will generate a second test image 50 and 52 corresponding to a second dimension of the test pads. The software for the measurement electronics then superimposes the second test image upon the first test image as shown in FIG. 2c which results in a final test image 54 and 56 which is the area of overlap between the first and second test images corresponding to test pads 38 and 40. The final test image is then compared to net list data or test pad data contained within the software. The software compares the stored data with the scanned data and if they match, the software eliminates those test pads from subsequent continuity testing to be done by conventional means such as by a prober.

If, for example, trace 39 was broken and did not properly electrically connect test pads 38 and 40, the wiper brushes would not have been able to generate the necessary final test image and the software would identify test pads 38 and 40 as potential problem areas needing further continuity testing by a prober.

The scan test apparatus eliminates test points from further continuity testing by electrically scanning the circuit board and looking for what is properly electrically connected in the circuit. By eliminating what is properly electrically connected, 80 to 90% of all test pads can be eliminated from testing by conventional methods. The scan test apparatus significantly reduces the time necessary to perform continuity testing on bare printed circuit boards.

Figure 3:
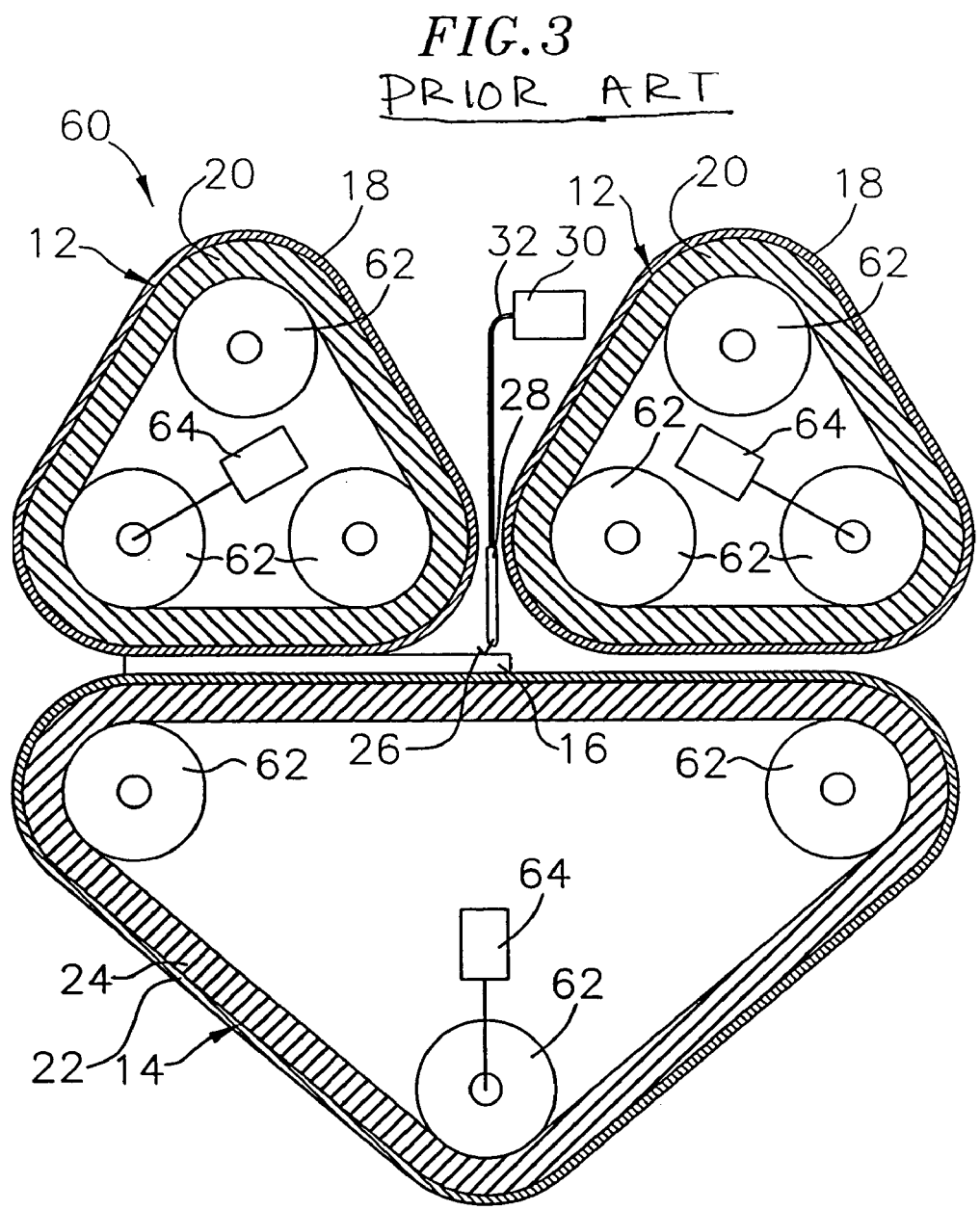
FIG. 3 is a side schematic view of an alternative embodiment scan test apparatus of U.S. Pat. No. 6,191,600 B1.

FIG. 3 illustrates an alternative embodiment scan testing apparatus 60 of U.S. Pat. No. 6,191,600 B1. In this scan testing apparatus, the upper and lower shorting layers 12 and 14 are formed in a continuous loop around rollers 62 which are driven by a motor 64. In this embodiment, the unit under test 16 is driven past the wiper brushes by the upper and lower shorting layers to generate the test images.

Figure 4:
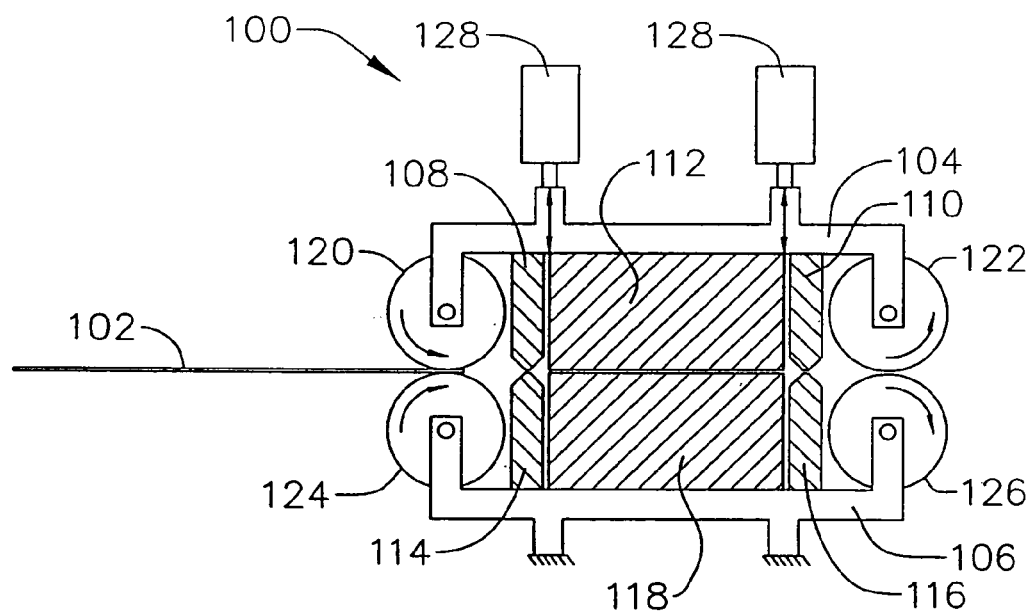
FIG. 4 is a side schematic view of a first embodiment scan test apparatus of the present invention.

The scan test apparatus of the present invention is illustrated in FIGS. 4–17. FIG. 4 illustrates a scan test apparatus 100 for double-sided scanning of a printed circuit board 102. Apparatus 100 includes upper housing 104 and lower housing 106 between which the printed circuit board is passed. Upper housing 104 includes a forward electrical contactor 108 and a rear electrical contactor 110 positioned on either side of a shorting matrix 112. Similarly, lower housing 106 includes forward electrical contactor 114 and rear electrical contactor 116 positioned on either side of a shorting matrix 118. Upper housing 104 includes forward and rear drive rollers 120 and 122, which cooperate with forward and rear drive rollers 124, 126 attached to lower housing 106. In this embodiment, lower housing would be rigidly connected to a base and upper housing would be biased toward the lower housing by actuators 128. The actuators could be a linear motor, a pneumatic or hydraulic cylinder, or a spring. The printed circuit board is scanned by the drive rollers, which are geared and driven by a motor, drawing the printed circuit board through the forward electrical actuators, the shorting matrix and the rear electrical contactors and ultimately out of the scan test apparatus through the rear drive rollers. In this embodiment, the electrical contactors can be wiper brushes or test probes, such as accordion probes, beam probes, or flex circuit fingers. The shorting matrix can be a conductive and compliant layer as shown in FIG. 1 or can be a metal plate.

Figure 5:
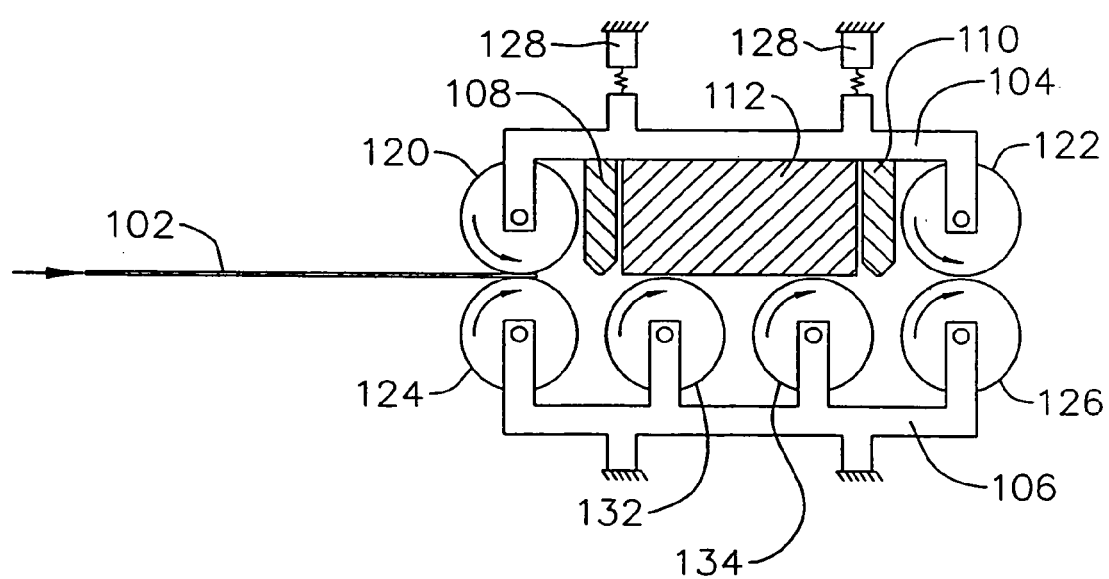
FIG. 5 is a side schematic view of a second embodiment scan test apparatus.

FIG. 5 shows another alternative embodiment scan test apparatus 130 for single-sided scanning. This embodiment is similar to FIG. 4, except the forward and rear electrical contactors 114, 116 and shorting matrix 118 in the lower housing 106 has been replaced with additional drive rollers 132 and 134. This embodiment would be used when only one side of the printed circuit board requires testing.

Figure 6:
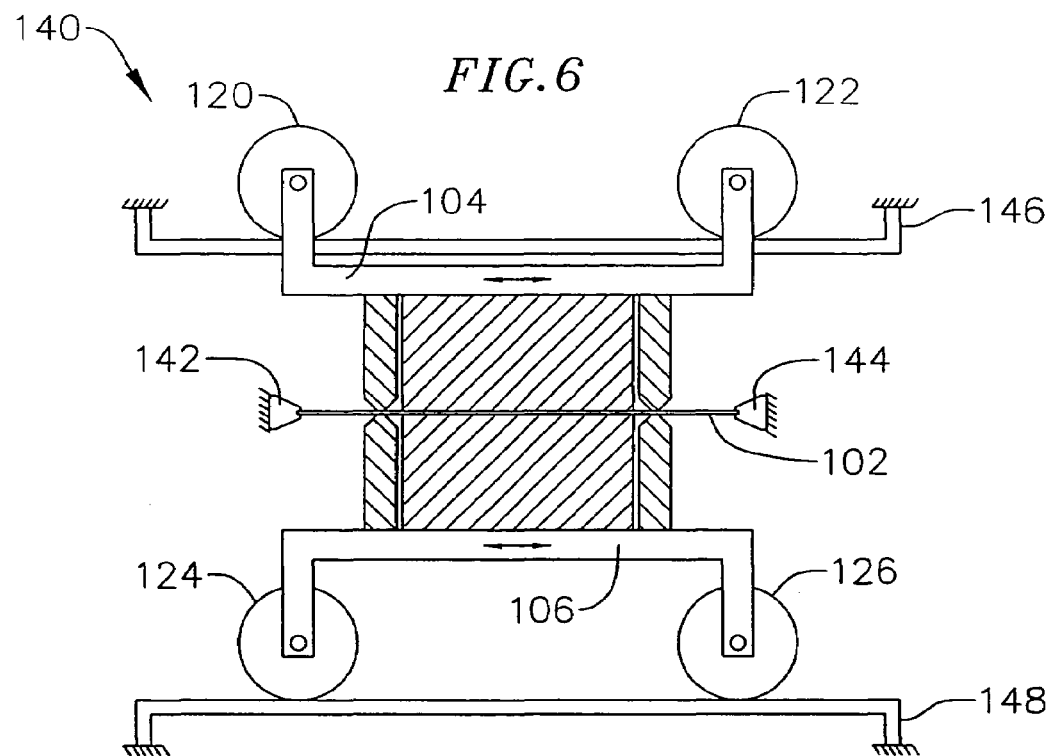
FIG. 6 is a side schematic view of a third alternative embodiment scan test apparatus.

FIG. 6 illustrates another embodiment scan test apparatus 140 where the printed circuit board 102 would be held stationary by mounting chucks 142 and 144 positioned on either side of the printed circuit board. In this embodiment, the drive rollers 120 and 122 of upper housing 104 traverse a fixed rail 146. Similarly, drive rollers 124 and 126 of lower housing 106 ride on a lower rail 148. Scan test apparatus 140 includes electrical contactors and shorting matrix positioned on the upper and lower housings similar to scan test apparatus 100 of FIG. 4 for double-sided scanning of the printed circuit board 102.

Figure 7:
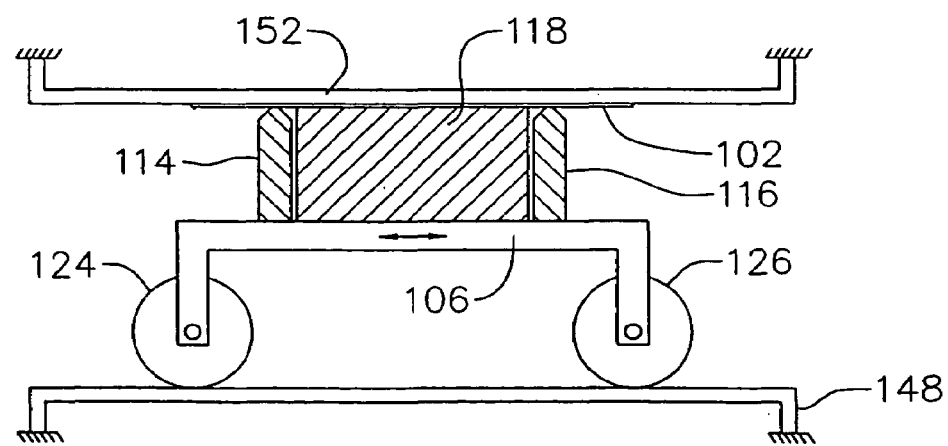
FIG. 7 is a side schematic view of a fourth alternative embodiment scan test apparatus.

FIG. 7 illustrates yet another embodiment scan test apparatus 150 wherein the printed circuit board 102 is held stationary for single-sided scanning. The printed circuit board is held stationary by a vacuum or mounting plate 152. The scan test apparatus 150 includes a lower housing 106 having drive rollers 124 and 126 which ride on rail 148. Similarly, electrical contactors 114 and 116 are positioned on either side of the shorting matrix 118. Although FIG. 7 illustrates single-sided scanning for the lower surface of the printed circuit board 102, it is to be understood that the top surface of the printed circuit board similarly could be scanned in one-sided scanning utilizing only the upper portion of scan test apparatus 140.

Figure 8:
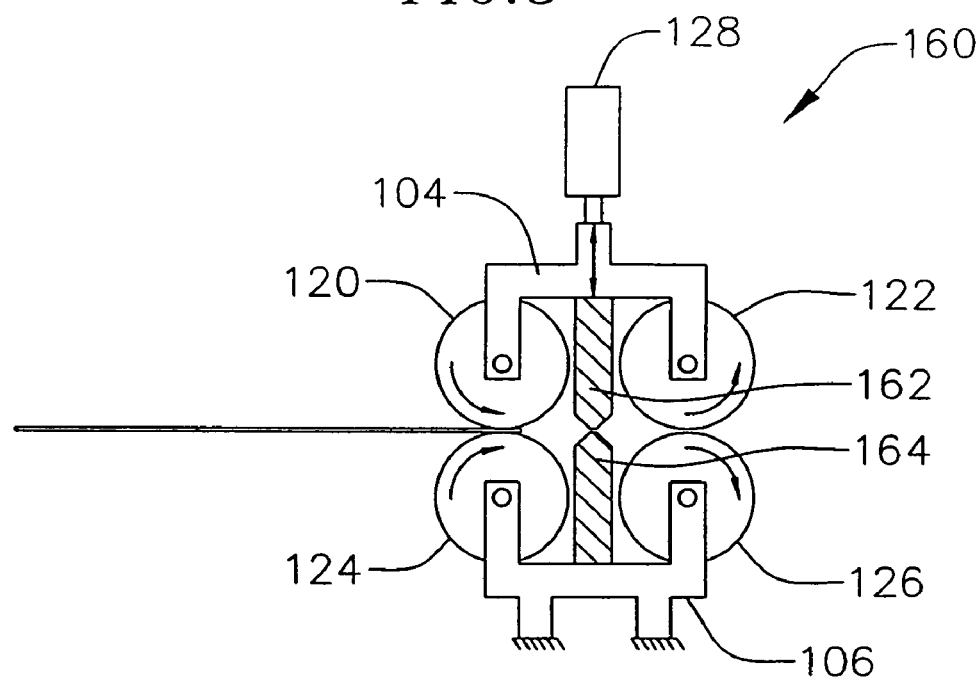
FIG. 8 is a side schematic view of a fifth alternative embodiment scan test apparatus.

FIG. 8 shows yet another embodiment scan test apparatus 160 wherein the electrical contactors 162 and 164 positioned in upper housing 104 and lower housing 106, respectively, perform a double-sided charge rise time (CRT) measurement. CRT measurement measures the capacitance build-up in nets on the printed circuit board. This scan test apparatus 160, as well as the other embodiments disclosed herein, which perform non-contact testing, include non-contact measurements of capacitance, forced modulation microscopy, phase detection microscopy, electrostatic force microscopy, scanning capacitance microscopy, scanning thermal microscopy, near-field scanning optical microscopy, nanolithography, pulsed force mode, micro-thermal analysis, conductive AFM, E-beam technology, plasma charge and laser beam.

Figure 9:
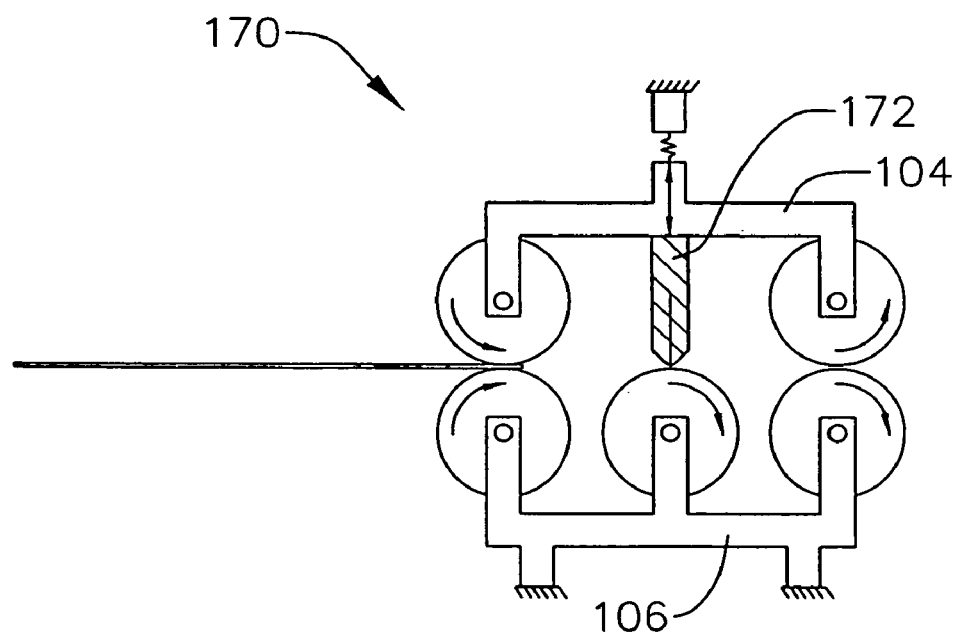
FIG. 9 is a side schematic view of a sixth alternative embodiment scan test apparatus.

FIG. 9 illustrates another scan test apparatus 170 similar to scan test apparatus 160, which provides single-sided CRT measurement. In this embodiment, only a single electrical contactor 172 is positioned on either the upper housing 104 or lower housing 106, depending upon the side of the printed circuit board requiring testing.

Figure 10:
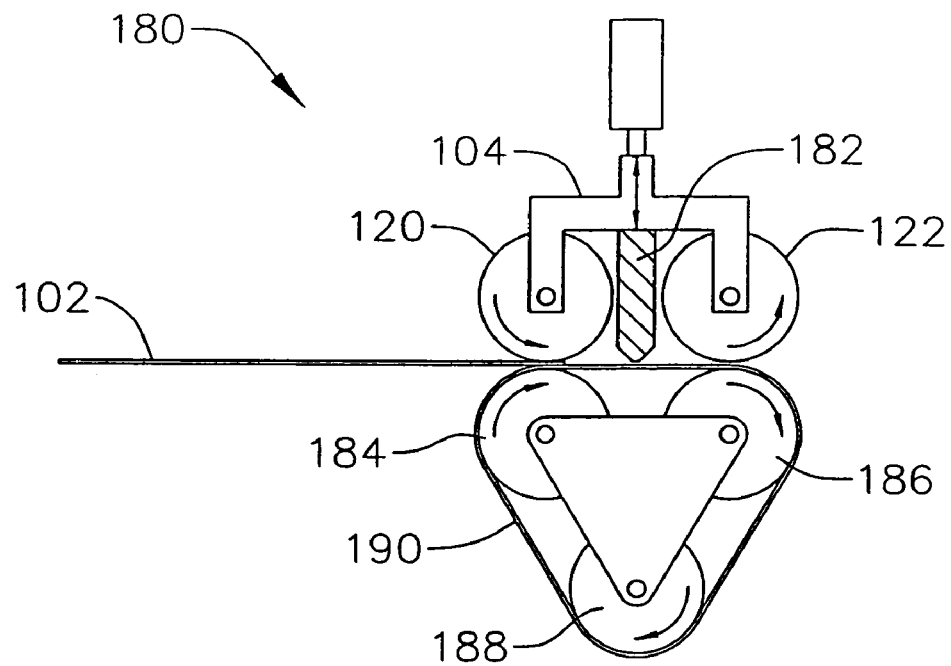
FIG. 10 is a side schematic view of a seventh alternative embodiment scan test apparatus.

FIG. 10 illustrates another scan test apparatus 180 which performs single-sided scanning on the printed circuit board 102. In this embodiment, the scan test apparatus 180 includes an upper housing 104 with drive rollers, 120 and 122. An electrical contactor 182 is positioned between the drive rollers. Located below the printed circuit board are three drive rollers 184, 186 and 188 having a conductive belt or cloth 190 which serves as a shorting matrix for the printed circuit board.

Figure 11:
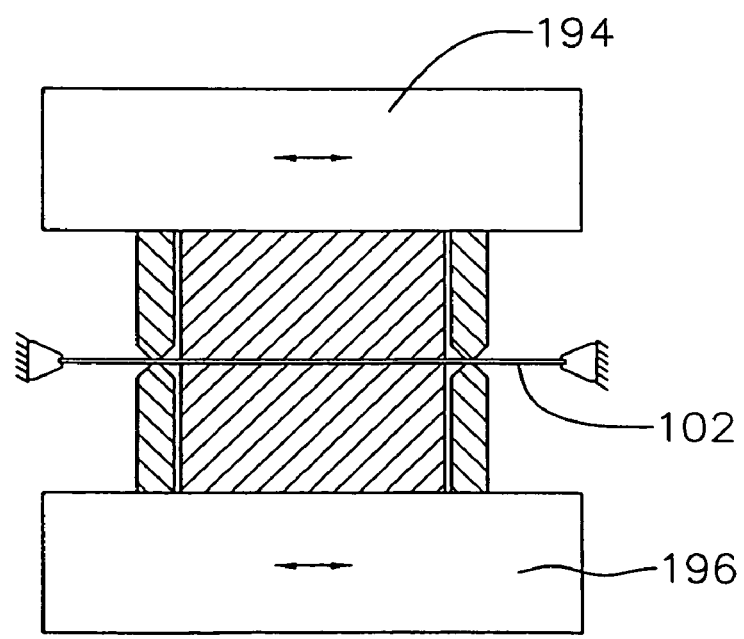
FIG. 11 is a side schematic view of an eighth alternative embodiment scan test apparatus.

FIG. 11 illustrates an alternative embodiment scan test apparatus 192 similar to FIG. 6, with the exception that the housing and drive roller assemblies have been replaced with motion units 194 and 196. These motions units can be a linear motor, pneumatic or hydraulic cylinders which move together for double-sided scanning of the printed circuit board.

Figure 12:
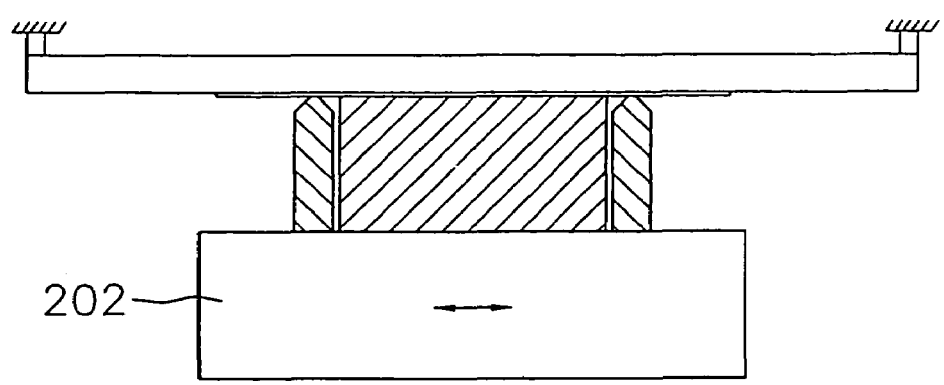
FIG. 12 is a side schematic view of a ninth alternative embodiment scan test apparatus.

FIG. 12 illustrates a scan test apparatus 200 similar to FIG. 7 wherein the housing and drive roller assembly is replaced with a motion unit 202 as shown in FIG. 11. The scan test apparatus 200 is used for single-sided scanning of the printed circuit board. Again, this embodiment can be used for scanning either side of the printed circuit board as required.

Figure 13:
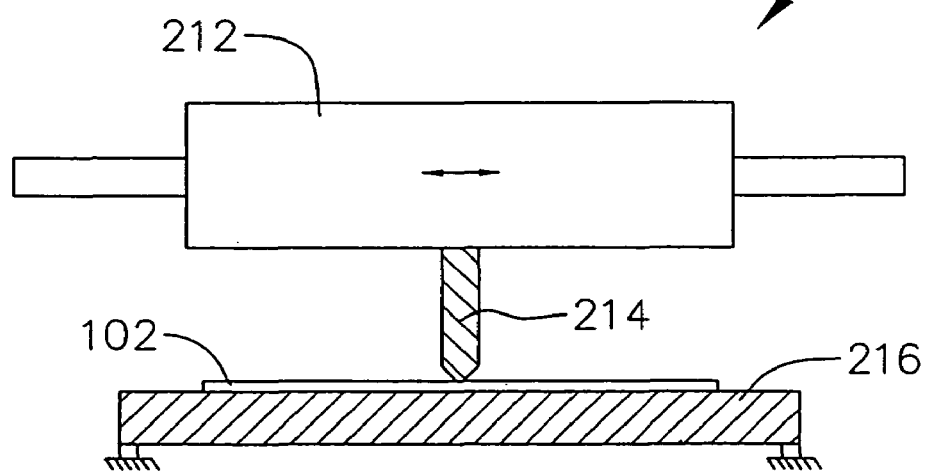
FIG. 13 is a side schematic view of a tenth alternative embodiment scan test apparatus.

FIG. 13 illustrates a scan test apparatus 210, including a motion unit 212 and an electrical contactor 214 for single-sided scanning of the printed circuit board 102. The printed circuit board 102 is held stationary by the shorting vacuum plate or mounting plate 216.

Figure 14:
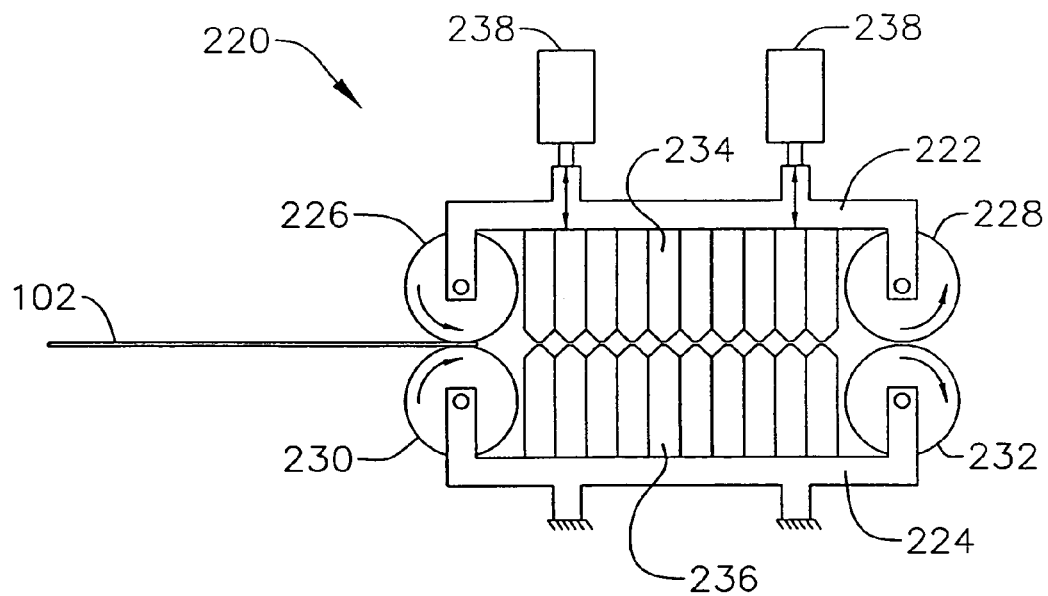
FIG. 14 is a side schematic view of an eleventh alternative embodiment scan test apparatus.

FIG. 14 illustrates a scan test apparatus 220, including an upper housing 222 and a lower housing 224. Upper housing 222 includes drive rollers 226 and 228, and lower housing 224 includes drive rollers 230 and 232. Each of upper housing 222 and lower housing 224 includes an array of electrical contactors 234 and 236, respectively. Scan test apparatus 220 performs double-sided scanning wherein the electrical contactor array is used for selective shorting and measurement. The solid array of contactors 234 and 236 selectively measure and short combinations of areas of the printed circuit board 102 in order to achieve the desired measurements. Scan test apparatus 220 also includes actuators 238 to bias the upper and lower housings towards one another.

Figure 15:
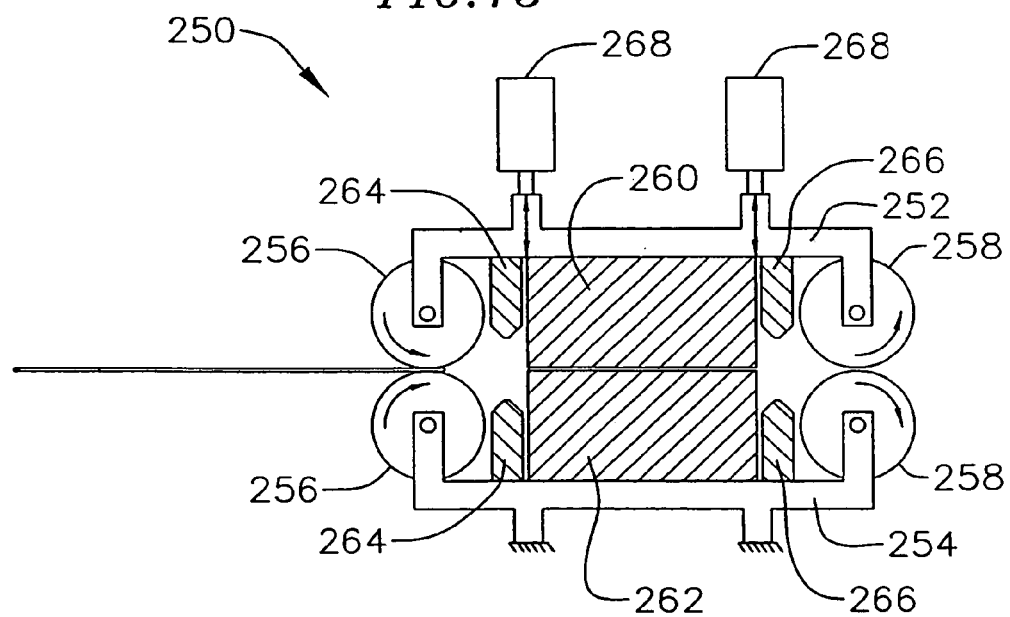
FIG. 15 is a side schematic view of a twelfth alternative embodiment scan test apparatus.

FIG. 15 illustrates another alternative embodiment scan test apparatus 250 for double-sided scan testing having non-contact sensors. Apparatus 250 includes upper housing 252 and lower housing 254. Each of the upper and lower housing has a forward drive roller 256 and a rear drive roller 258. Upper and lower shorting matrixes 260 and 262 are connected to the upper and lower housings, respectively. Leading non-contact sensors 264 and rear non-contact sensors 266 are positioned adjacent the shorting matrixes 260 and 262. Upper and lower housings are biased by actuators 268.

Figure 16:
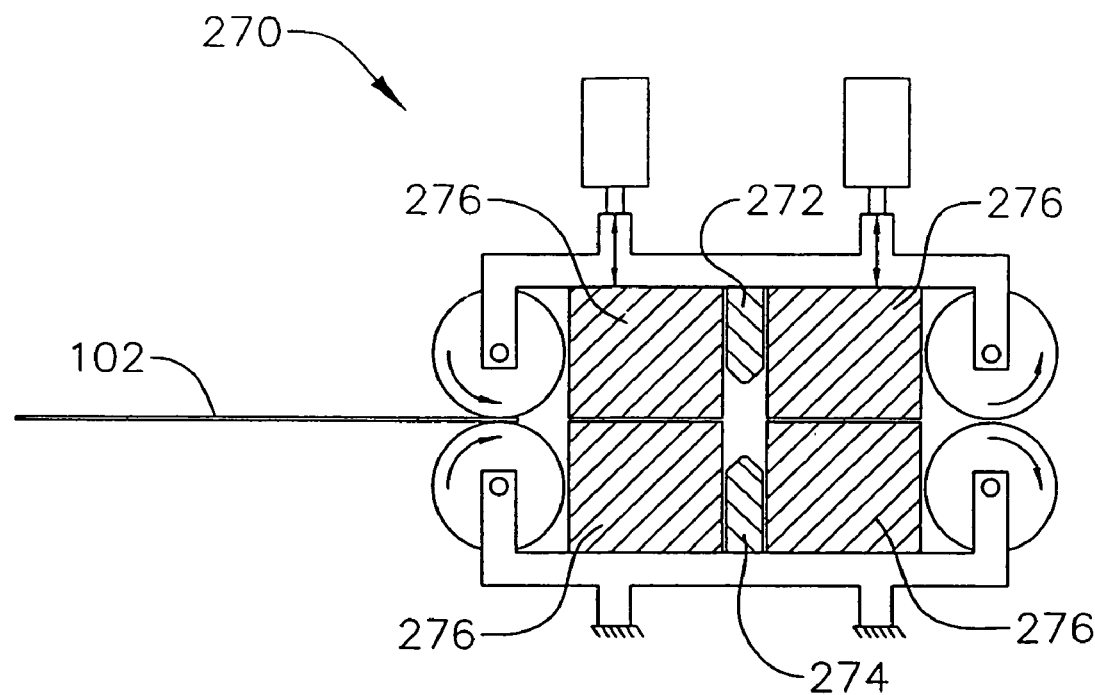
FIG. 16 is a side schematic view of a thirteenth alternative embodiment scan test apparatus.

FIG. 16 illustrates another alternative embodiment scan test apparatus 270 having one non-contact sensor 272 positioned above and below the printed circuit board 102 for double-sided non-contact scanning. Shorting matrix 276 is positioned on either side of the upper and lower non-contact sensors 272 and 274.

Figure 17:
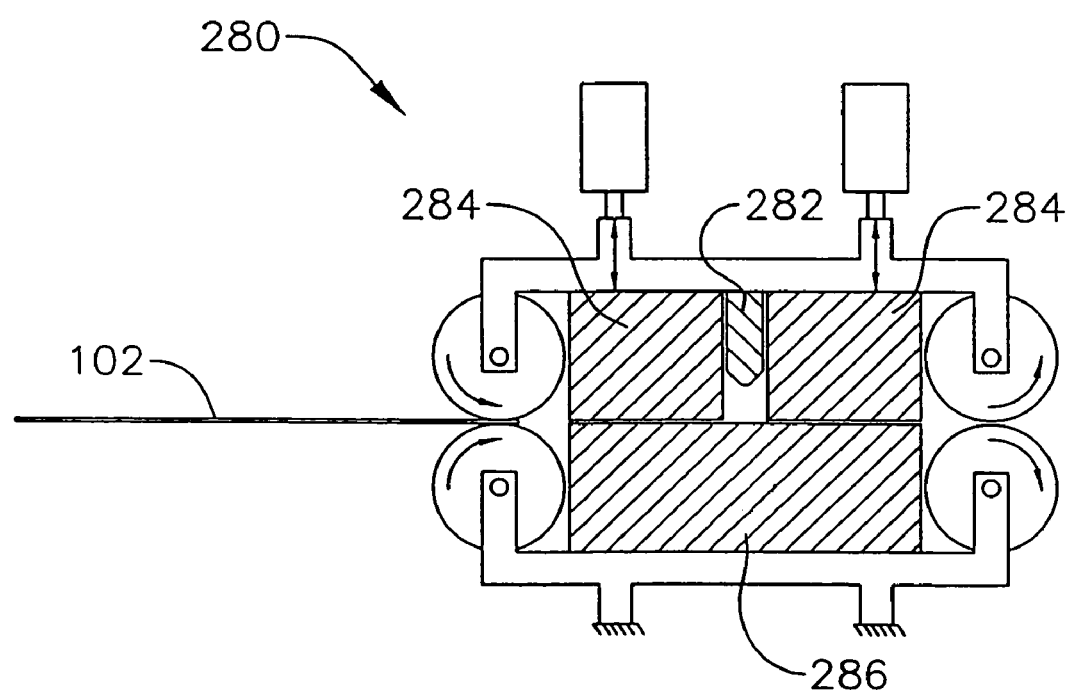
FIG. 17 is a side schematic view of a fourteenth alternative embodiment scan test apparatus.

FIG. 17 illustrates another embodiment scan test apparatus 280 for single-sided non-contact scanning having one non-contact sensor 282 positioned on one side of the printed circuit board and having shorting matrix 284 positioned on either side of the sensor. Shorting matrix 286 is positioned on the opposite side of the printed circuit board 102. Scan test apparatus 280 could incorporate only shorting matrix 286 or only shorting matrixes 284 with additional drive rollers on the lower housing. In all of the embodiments disclosed herein, the electrical contactors each may be connected to the test electronics through separate switches or can be connected directly to measurement circuits. Alternatively, a decoder card could be used to filter out measurement noise before evaluating the signals using a measurement board for the scan test apparatus. The embodiments of the present invention do not require that the entire board be shorted simultaneously and can be programmed depending upon the requirements of the printed circuit board under test. The scan test apparatus also can be programmed to be self-learning without the use of control data. Any embodiments utilizing CRT can perform a 100% test without the need for the use of an additional prober.

Figure 18:
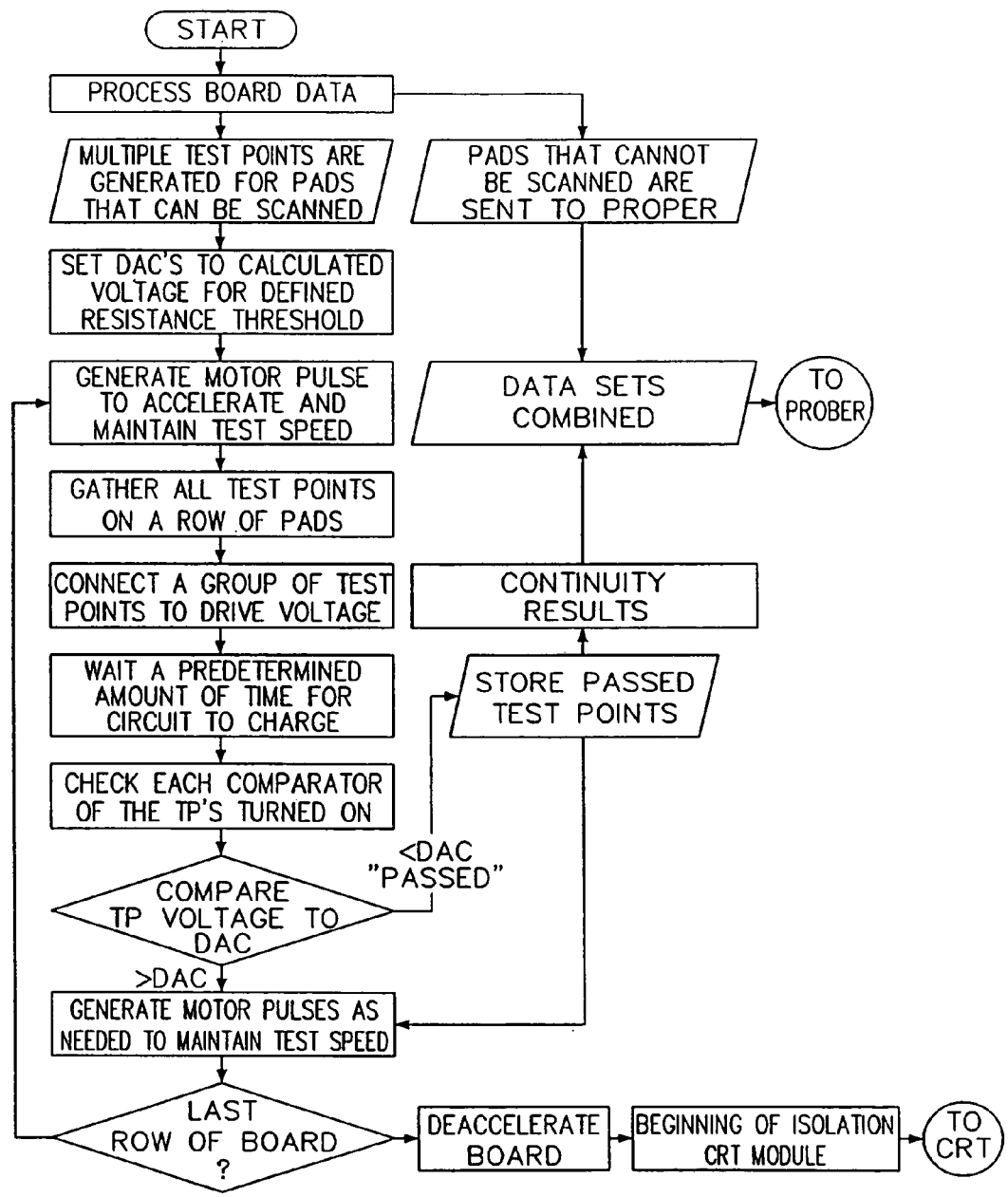
FIGS. 18–20 are schematic software flow diagrams illustrating continuity, isolation and proper test modules.
Figure 19:
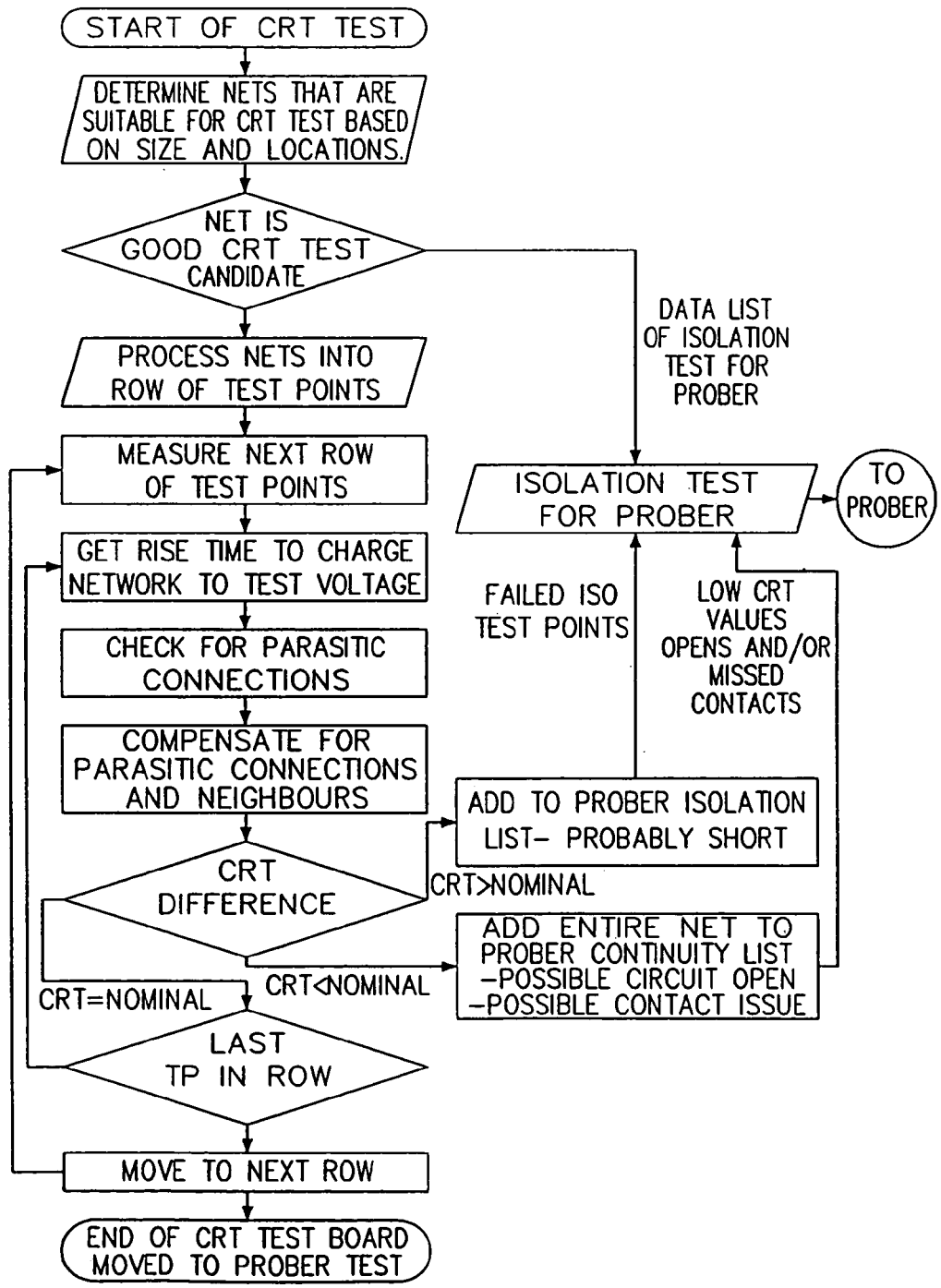
Figure 20:
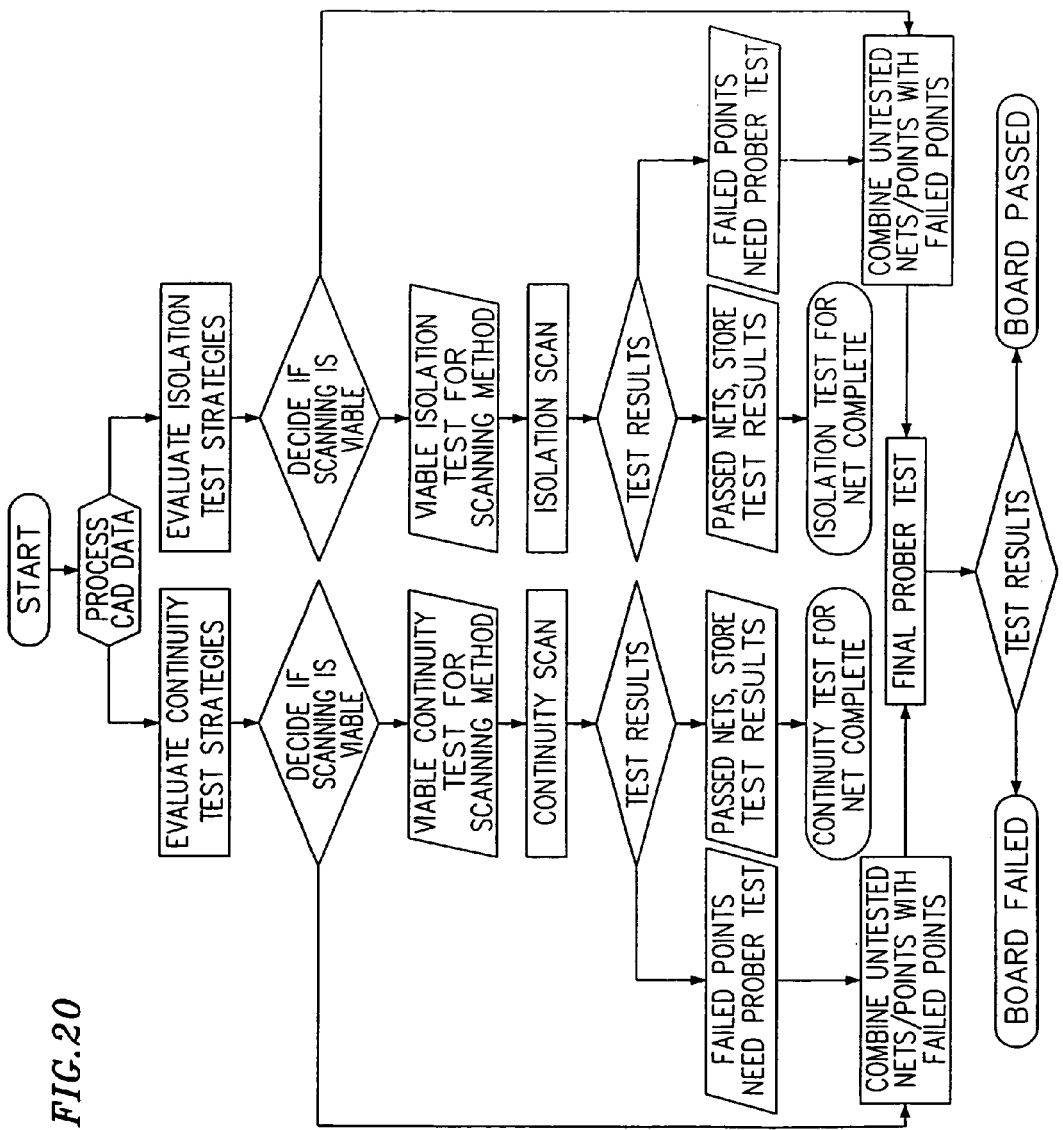

As shown in FIGS. 18–20, the scan test apparatus of the present invention performs a continuity test wherein the board data is first accessed and aligned to match the board positions within a reasonable tolerance. Based on user settings for desirable test thresholds, ADAC is programmed with a comparison voltage for pass/fail results. Next, the board is moved under two sets of electrical contactors (leading and trailing sets, each set consisting of a row of contacts on a top and bottom of the unit under test) and a grounding plate in such a manner as to synchronize the position of the board with the measurement system. The measurement system stimulates each contact or group of contacts with a known voltage through a load resistor, the pads and networks on the unit under test and eventually the ground plate. After waiting for the capacitance to charge, the voltage and the contact is compared via hardware to the comparison voltage and the result is stored for analysis. This is repeated multiple times for each pad to allow contact redundancy and positionable tolerance. The data from the contacts is combined with a second sweep at 90° rotation to maximum coverage on complex networks. The results are compared to the expected values and used to eliminate nets from the final prober test section. In the isolation test module shown in FIG. 19, the board data is first accessed and aligned to match the board position within a reasonable tolerance. All possible test locations are analyzed and a limited number of optimal locations are selected to tested the maximum number of networks and the fewest number of movements. The board is moved under a single set of context (upper and lower) to pre-calculated test positions. At each test position, the time required to charge the net (CRT) between preselected voltages as recorded. After compensating for the test systems impact on the time (CRT), the net result is compared to that of a known good board. This comparison will indicate the network is free of isolation defects (pass), the network is opened (Delta CRT too small=fail) where the network is shorted to another network (Delta CRT too large=fail short). Networks that do not pass are dynamically routed to the prober for retest and/or defect confirmation.

As shown in FIG. 20, the scan test apparatus then conducts a proper test module wherein the board data is first accessed and aligned to match the board position within a reasonable tolerance. The unverified and failed pads from the continuity test module and the unverified and failed networks from the isolation test modules (a small subset of the original board data) are then tested on the prober module and the final test results (pass or fail) is applied to the finished board.

The present invention has been described and is illustrated with respect to embodiments thereof, it is to be understood that it is not to be so limited, since changes and modifications may be made therein which are within the full intended scope of this invention as hereinafter claimed.

What is claimed is:

1. A scan test apparatus for testing a printed circuit board comprising:
   a motion unit for moving the scan test apparatus with respect to the printed circuit board;
   a shorting matrix connected to the motion unit;
   a first electrical contactor connected to the motion unit and positioned on one side of the shorting matrix;
   a second electrical contactor connected to the motion unit on an opposite side of the shorting matrix; and
   a mounting plate opposite the shorting matrix and electrical contactors for supporting the printed circuit board.

2. The scan test apparatus of claim 1 wherein the motion unit is a housing and drive rollers.

* * * * *